(12) United States Patent
Rose et al.

(10) Patent No.: US 6,602,739 B1
(45) Date of Patent: Aug. 5, 2003

(54) METHOD FOR MAKING MULTICHIP MODULE SUBSTRATES BY ENCAPSULATING ELECTRICAL CONDUCTORS AND FILLING GAPS

(75) Inventors: James Wilson Rose, Guilderland, NY (US); Thomas Bert Gorczyca, Schenectady, NY (US); Christopher James Kapusta, Duanesburg, NY (US); Ernest Wayne Balch, Ballston Spa, NY (US); Kevin Matthew Durocher, Waterford, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/101,231

(22) Filed: Mar. 19, 2002

Related U.S. Application Data
(60) Provisional application No. 60/339,968, filed on Oct. 31, 2001.

(51) Int. Cl.$^7$ .......................... H01L 21/44; H01L 21/48; H01L 21/50
(52) U.S. Cl. .................. 438/126; 438/106; 438/109; 438/125
(58) Field of Search ................................ 438/106, 109, 438/125, 126

(56) References Cited

U.S. PATENT DOCUMENTS

| | | | |
|---|---|---|---|
| 4,783,695 A | | 11/1988 | Eichelberger et al. ......... 357/65 |
| 5,324,687 A | * | 6/1994 | Wojnarowski .............. 438/107 |
| 5,373,627 A | * | 12/1994 | Grebe ......................... 29/841 |
| 5,492,586 A | | 2/1996 | Gorczyca .................... 156/245 |
| 5,866,952 A | | 2/1999 | Wojnarowski et al. ...... 257/788 |
| 6,429,045 B1 | * | 8/2002 | Furukawa et al. .......... 438/107 |

* cited by examiner

Primary Examiner—David L. Talbott
Assistant Examiner—David A. Zarneke
(74) Attorney, Agent, or Firm—Duane Morris LLP

(57) ABSTRACT

A method for making a multichip "HDI" module includes the step of making a substrate for supporting the semiconductor or solid-state chips (or other components) by applying electrical conductor in a pattern to a first dielectric sheet, and applying encapsulating material to the electrical conductor. Apertures are made in the first dielectric sheet and encapsulant at locations at which the chips (or other components) are to be located. The components are affixed to a second dielectric sheet at locations registered with the apertures in the first sheet, and the sheets are juxtaposed with the chips extending into the apertures. This results in the formation of gaps between the components and the edges of the apertures, which gaps are then filled with hardenable or curable material. Electrical connection is made to the pads of the chips by means of a multilayer structure of dielectric sheets with conductor patterns, interconnected by means of plated-through vias.

6 Claims, 4 Drawing Sheets

METHOD FOR MAKING MULTICHIP MODULE SUBSTRATES BY ENCAPSULATING ELECTRICAL CONDUCTORS AND FILLING GAPS

CROSS REFERENCE TO RELATED APPLICATIONS

This application relates to and claims the benefit of the earlier filing date under 35 U.S.C. 119, of U.S. Provisional Patent Application, Ser. No. 60/339,968 entitled "METHOD FOR MAKING MULTICHIP MODULE SUBSTRATES BY ENCAPSULATING ELECTRICAL CONDUCTORS AND FILLING GAPS," filed on Oct. 31, 2001.

FIELD OF THE INVENTION

This invention relates to high density interconnect (HDI) arrangements for electronic modules, and more particularly to methods for fabrication of such modules.

BACKGROUND OF THE INVENTION

High density interconnect assemblages such as those described in U.S. Pat. No. 4,783,695, issued Nov. 8, 1988 in the name of Eichelberger et al., and in numerous other patents, are finding increased usage. In one type of HDI assemblage, a dielectric substrate such as alumina has a planar surface defining one or more wells or depressions. Each well or depression extends below the planar surface by the dimension of a component which is to become part of the HDI assemblage. The component is typically an integrated circuit, having its electrical connections or contacts on an upper surface, but other components can be used. Each component is mounted in a well dimensioned to accommodate the component with its electrical contacts in substantially the same plane as the planar surface of the substrate. The components are typically held in place in their wells or depressions by an epoxy adhesive. A layer of dielectric material such as Kapton polyimide film, manufactured by DuPont of Wilmington, Del., is laminated to the devices using ULTEM polyetherimide thermoplastic adhesive, manufactured by General Electric Plastic, Pittsfield, Mass., which is then heat-cured at about 260° to 300° C. in order to set the adhesive. The polyetherimide adhesive is advantageous in that it bonds effectively to a number of metallurgies, can be applied in a layer as thin as 12 micrometers ($\mu$m) without formation of voids, and is a thermoplastic material, so that later removal of the polyimide film from the components is possible for purposes of repair by heating the structure to the plastic transition temperature of the polyetherimide while putting tension on the polyimide film.

Following the curing of the ULTEM adhesive layer holding the first sheet of dielectric film onto the components, through via apertures are laser-drilled through the dielectric film and its adhesive layer at the locations of at least some of the electrical connections. A patterned layer of titanium/copper/titanium electrical conductors is applied in a pattern to the exposed surface of the polyimide film, into the through vias, and onto the contacts of the components. This completes the formation of a first layer of electrical connections to the components. One or more additional thin sheets of polyimide dielectric material are layered onto the upper surfaces using silicone polyimide epoxy adhesive (SPIE). The SPIE is a thermoset material such as OXYSIM 600, manufactured by Occidental Chemical Corporation, Grand Island, N.Y., which is then cured at temperatures below 200°. Once set, the SPIE cannot be softened by heating. Each additional layer of polyimide film has its own pattern of through vias drilled as far as the upper titanium surface of a lower layer of titanium/copper/titanium conductor, followed by its own layer of titanium/copper/titanium deposition.

Alternative methods for making HDI modules include the "chip-on-flex" method, in which the solid-state chips are applied, electrode-side-down, onto an adhesive-faced dielectric layer. The chips are then encapsulated in a rigid molding material, which in one embodiment is Plaskon, an epoxy material, to form a rigid molded-chip-plus-dielectric-sheet piece. The flexible, multilayer interconnect sheet is then placed over the bottom of the dielectric sheet, which is to say on the side remote from the molding material, and the interconnections are made by means of laser-drilled vias.

SUMMARY OF THE INVENTION

Thus, a method according to an aspect of the invention is for generating a multi-chip module. The method comprises the steps of procuring a dielectric sheet defining a surface and tensioning the dielectric sheet, as by use of a frame, to provide a measure of rigidity to the surface. One or more electrical conductors is applied to the surface of the dielectric sheet in a predetermined pattern. The electrical conductors have a predetermined thickness. In one embodiment of the invention, the thickness is 40 thousandths of an inch, and the surface of the dielectric sheet is coated with adhesive to retain the conductors. Encapsulating material is applied to the surface of the dielectric sheet in a thickness sufficient to encapsulate the electrical conductors, to thereby generate a rigid substrate element. Wells or apertures, which may be through apertures, are fabricated, formed or defined in the rigid substrate element at predetermined locations at which semiconductor or solid-state chips are to be placed in or on the multi-chip module. The semiconductor or solid-state chips are placed on a second dielectric sheet or substrate at locations registered with the apertures or through apertures, with electrical pads, electrodes, or interconnects of the chips facing in a particular direction. In a particular embodiment of the invention, the second dielectric sheet has adhesive on one of its surfaces, and that side of the semiconductor or solid-state chips having electrical connection pads or electrodes of the semiconductor or solid-state chips are placed on the adhesive of the second sheet. The rigid substrate element with apertures is affixed to the second dielectric sheet with the semiconductor or solid-state chips extending into or through the wells or apertures. A flexible multilayer dielectric interconnection sheet carrying interconnection conductor patterns is formed on, andor applied over, at least the electrical connection pads or electrodes of some of the semiconductor or solid-state chips, for making connections between at least some of the interconnection conductor patterns of the interconnection sheet and some of the electrical connection pads. In a particular embodiment of the invention, the connections are made with the aid of plated-through vias.

In one variant of the method, a layer of encapsulant material is removed, shaved or ground from at least one surface of the rigid substrate element before the step of affixing the rigid substrate element to the second dielectric sheet. In another variant, the step of applying to the surface of the dielectric sheet, in a predetermined pattern, one or more electrical conductors having a predetermined thickness includes the step of applying adhesive to the surface of the dielectric sheet, and applying the one or more electrical conductors to the adhesive. In another mode of the method of the invention, an electrically conductive plate is affixed to the rigid substrate element on that side of the multichip module remote from the flexible multilayer dielectric interconnection sheet.

According to an aspect of the invention, the gaps between the rigid substrate element and the semiconductor or solid-state chips or other components and the associated wells or apertures are filled with a hardenable (curable) filler material. The filling may be accomplished by means of manually operated tools or by means of automatic or programmed dispensing machines.

DESCRIPTION OF THE INVENTION

Figure 1A:
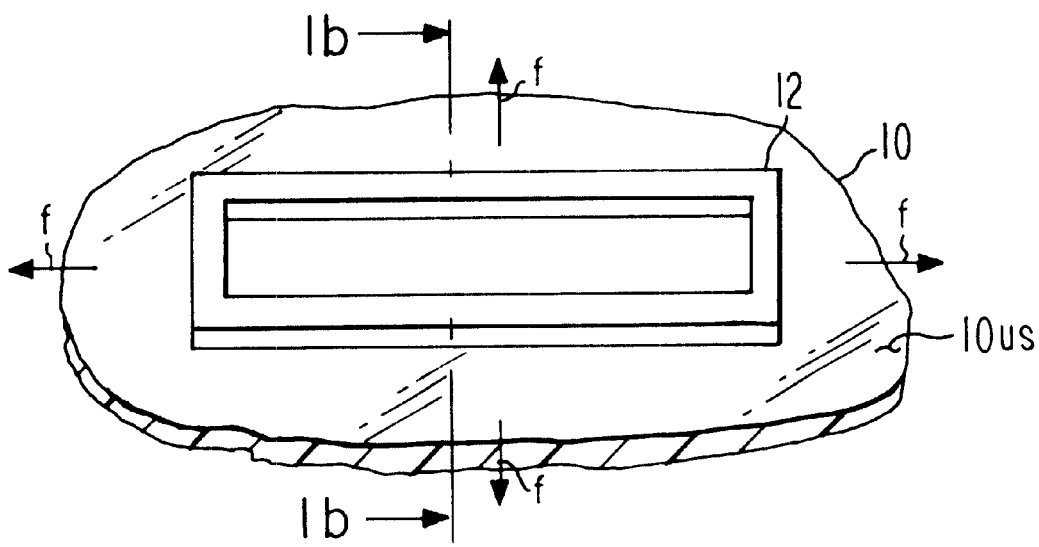
FIG. 1a is a simplified perspective or isometric view of a tensioned dielectric sheet onto which conductive slug material has been affixed.
Figure 1B:
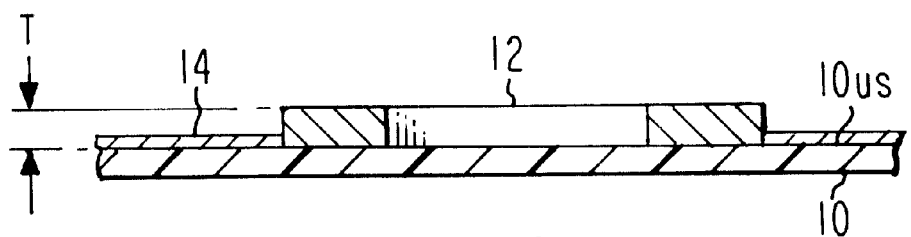
FIG. 1b is a cross-section of the structure of FIG. 1a looking in the direction 1b—1b.

In FIGS. 1a and 1b, a tensioned dielectric sheet 10 defines an upper surface 10us. The tensioning may be applied by way of a frame, as known in the art, to produce a radial outward force indicated by arrows f. The upper surface 10us may be coated with adhesive. A layer of electrically conductive material 12 is affixed to the upper surface 10us of dielectric sheet 10, as for example by application of a layer 14 of adhesive to the upper surface 10us. Conductive layer 12 may have any thickness T, but in one embodiment of the invention, has a thickness of 0.040 inch. Such a thickness of material may possibly be better fabricated by stamping rather than by deposition, but any method will do, including machining from a block of conductive metal. As illustrated, the conductive pattern is in the form of an open rectangle or surrounding wall. Such a pattern can be useful in the context of electrically shielding components lying within the enclosed portion. Such a shape may also be useful for grounding electrical circuits, especially if the electrically conductive piece 12 is itself connected to an external ground.

Figure 2:
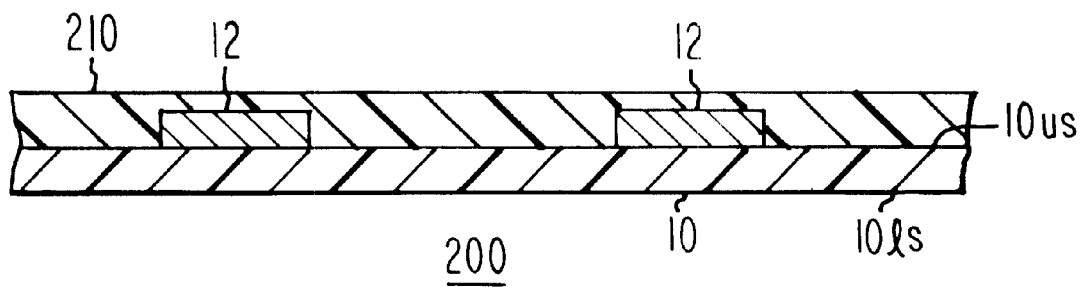
FIG. 2 is a simplified cross-section of the structure of FIGS. 1a and 1b after encapsulation.

In FIG. 2, the structure of FIG. 1b has been covered with a layer of encapsulating or fill material 210. In one embodiment, the encapsulating material is the abovementioned Plaskon material. Once the encapsulating material is hardened, the layer becomes rigid to thereby define a rigid substrate element 200, although the thickness of the element is such that it may be somewhat flexible overall. As illustrated in FIG. 2, the encapsulating material 210 fills the region between the exposed portions of the electrically conductive material 12. As illustrated in FIG. 2, the layer 210 of encapsulant material may be thick enough to extend over the electrically conductive portions 12.

Figure 3:
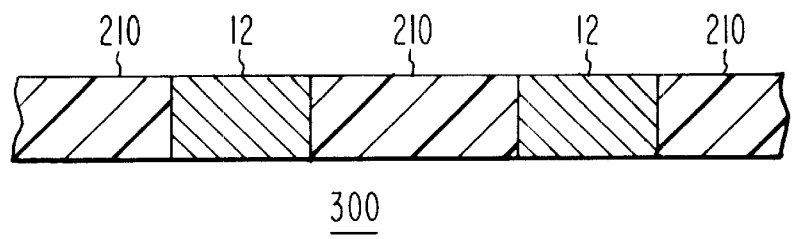
FIG. 3 is a simplified cross-section of the structure of FIG. 2 after removal of excess encapsulation and dielectric sheet.

FIG. 3 is a simplified cross-sectional view of the structure of FIG. 2 after the step of grinding or lapping both upper and lower surfaces of the structure to thereby expose the electrically conductive portions 12 at both surfaces.

Figure 4A:
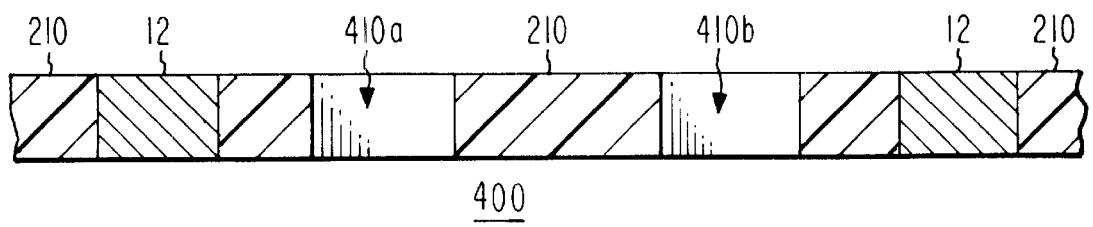
FIG. 4a is a simplified cross-sectional view, and FIG. 4b a simplified perspective or isometric view, of the structure of FIG. 3 after the defining of apertures for placement of chips.
Figure 4B:
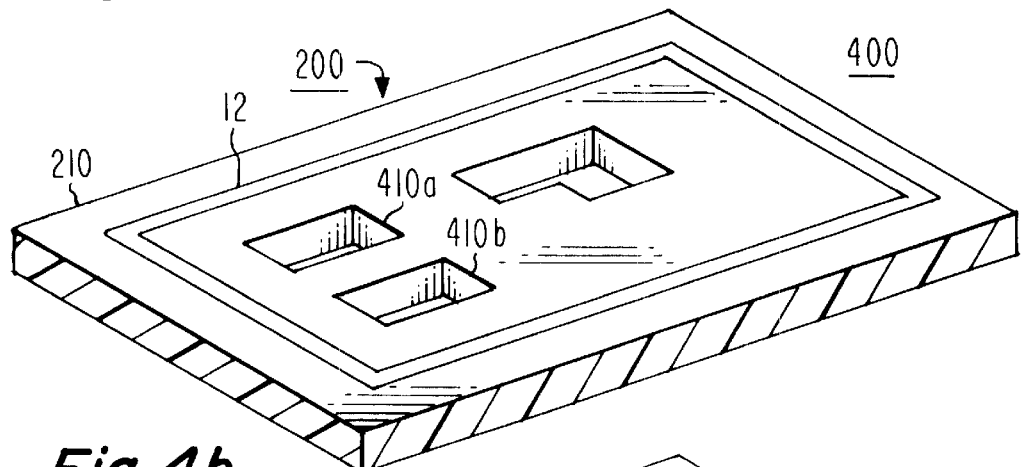

FIGS. 4a and 4b illustrate the result of forming apertures 410a and 410b within the region which is electrically shielded by the presence of electrically conductive slug 12. The apertures are dimensioned to accommodate the various semiconductor or solid-state chips (chips) which are intended for mounting therein.

Figure 5:
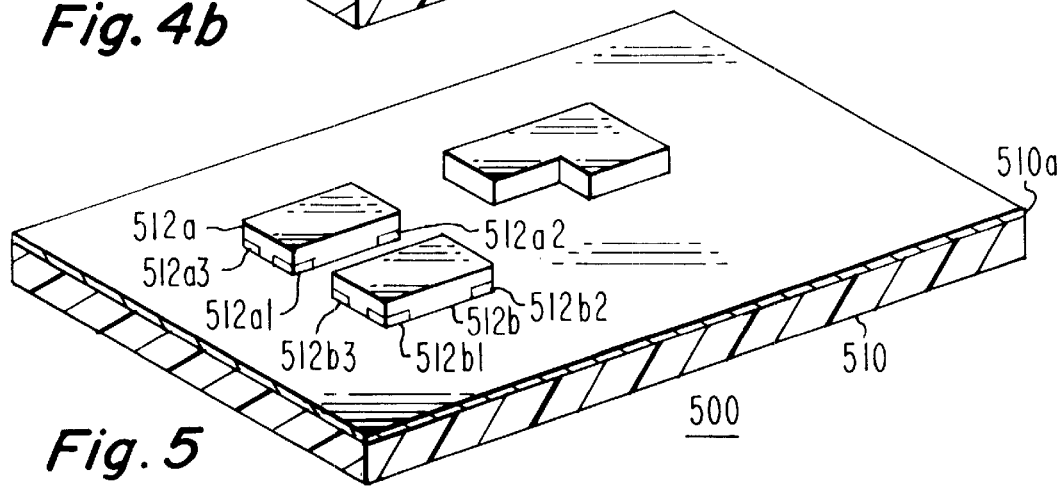
FIG. 5 is a simplified perspective or isometric view of another dielectric sheet with semiconductor or solid-state chips mounted thereon in a pattern registered with the apertures of the structure of FIGS. 4a and 4b.

FIG. 5 illustrates a structure 500 including a sheet 510 of dielectric material on which a plurality of semiconductor or solid-state chips, two of which are designated 512a and 512b, are mounted. The mounting of the chips 512a and 512b is such that the electrical connections or pads of the chips, some of which are designated 512a1, 512a2, 512a3, 512b1, 512b2, and 512b3, are adjacent the dielectric sheet 510. The mounting may be accomplished by applying adhesive to either the electrical connection sides of the chips or to the dielectric sheet 510, and bringing the chips into contact with the dielectric sheet 510. The locations of the chips are selected to be registered with each other and with the apertures 410a and 410b in structure 400 of FIGS. 4a and 4b.

Figure 6:
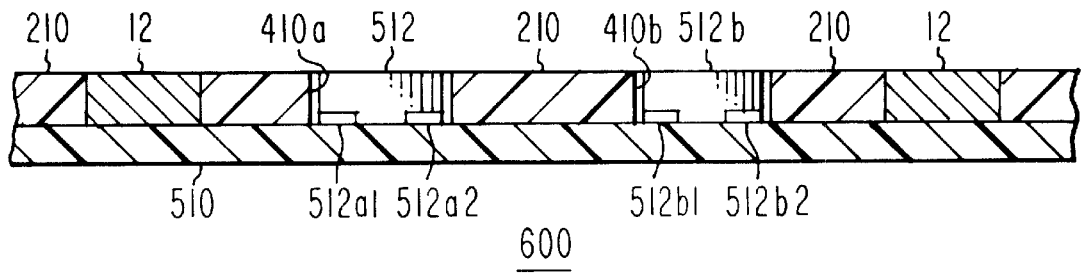
FIG. 6 is a simplified cross-sectional view of the structure of FIGS. 4a and 4b juxtaposed with that of FIG. 5.

FIG. 6 is a cross-sectional view of the combined structures 400 of FIG. 4 with 500 of FIG. 5. In FIG. 6, the semiconductor or solid-state chip 512a lies within aperture 410a, and chip 512b lies within aperture 410b. The resulting structure is designated 600.

Figure 7:
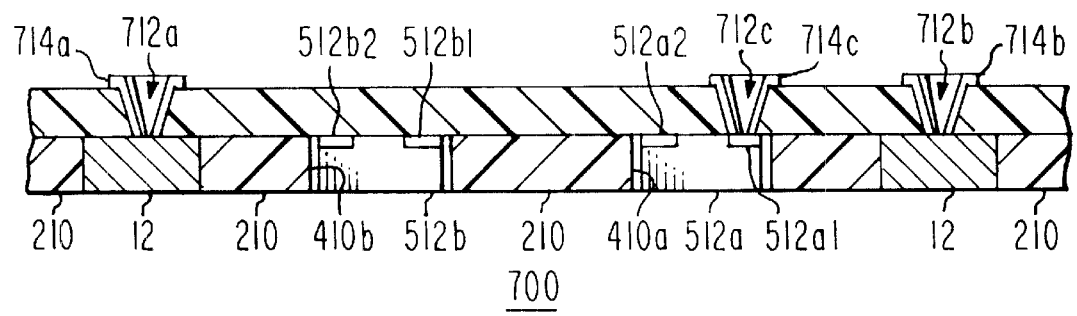
FIG. 7 is a simplified cross-sectional view of the structure of FIG. 6, with the addition of through vias and circuit metallizations or depositions.

FIG. 7 illustrates the structure 600 of FIG. 6, turned over for convenience in understanding, with layer 510 of dielectric material lying above the remaining structure. As illustrated in FIG. 7, through vias 712a, 712b, and 712c are made in the conventional manner through dielectric material 510 at the locations of the conductive slugs 12 and at the location of a contact pad 512a1 of semiconductor or solid-state chip 512a. Metallizations 714a and 714b overlie the locations of electrically conductive slugs 12, while metallization 714c overlies one of the electrical contacts or pads of semiconductor or solid-state chip 512a.

Figure 8:
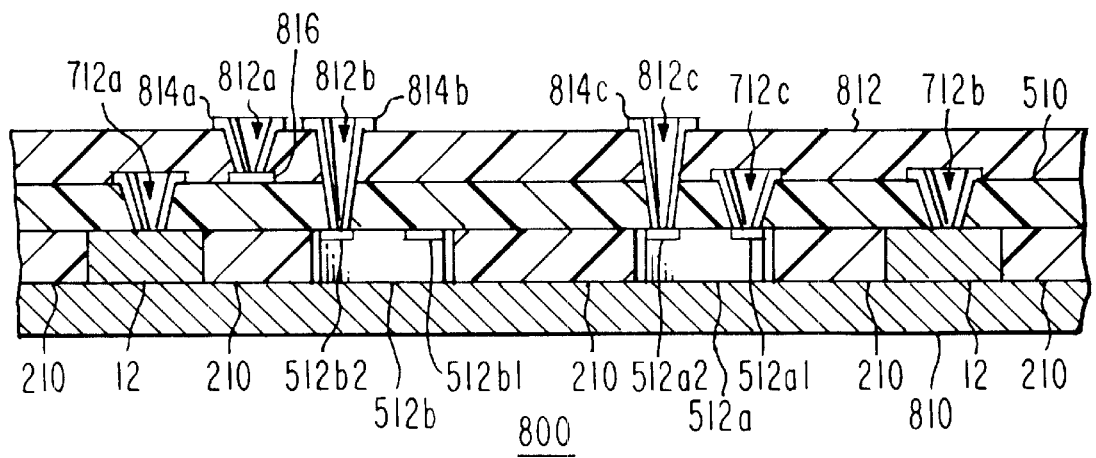
FIG. 8 is a simplified cross-sectional view of a completed multi-chip module including a ground/thermal coupling plate.

FIG. 8 is a cross-sectional view of a structure 800 built up from structure 700 of FIG. 7. Structure 800 includes a further heat-sink layer 810 affixed to the bottom of structure 700, and thermally coupled at least to the lower surfaces of semiconductor or solid-state chips 512a and 512b, for aiding in carrying away heat therefrom. Alternatively, or in addition, the heat sink layer 810 can be electrically conductive, and be in galvanic contact with the electrically conductive slugs 12. In addition, a further dielectric interconnect layer 812 is affixed to the upper surface of layer 510. Interconnect layer 812 includes further through vias and metallizations, for making other connections. More particularly, dielectric interconnect layer 812 has through vias and metallizations 814a, 814b, and 814c made therethrough at locations of an intermediate-level connection pad 816, and at the locations of contact pads 512b2 and 512a2.

Figure 9:
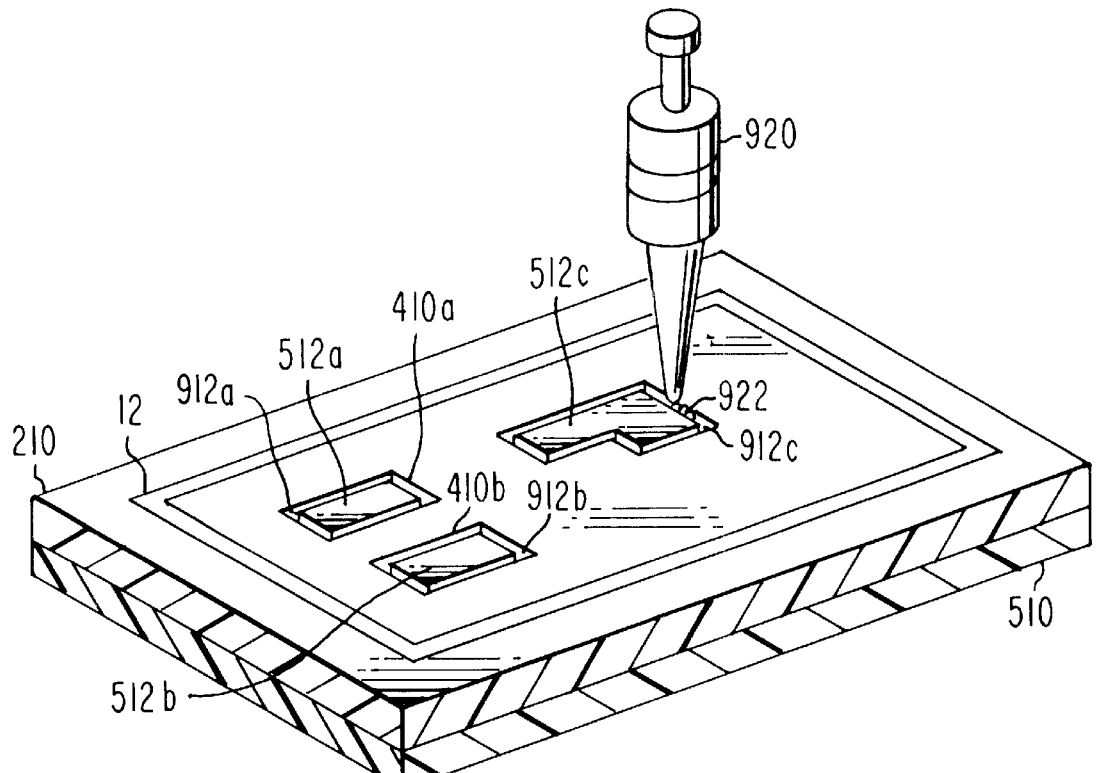
FIG. 9 is a perspective or isometric view of the upper surface of the partially completed structure of FIG. 6, illustrating gaps in the structure.

FIG. 9 is a simplified perspective or isometric view of the upper portion of structure 600 of FIG. 6, illustrating the dielectric sheet 510, the electrical conductor 12 encapsulated in molding material 210, and chips 512a, 512b, and 512c extending into apertures 410a, 410b, . . . defined in the molding material 210. Due to the necessity for reliable insertion of the chips 512a, 512b, . . . into the apertures 410a, 410b, . . . , the apertures must necessarily be at least slightly oversized, to accommodate tolerance build-up. This tends to result in a gap on at least one side of each chip. The gaps are designated 912a, 912b, and 912c in FIG. 9.

It has been discovered that the gaps lying between the semiconductor chips and the surrounding encapsulating material may not be of uniform thickness, and in some locations may be totally absent. In those cases in which the gap is absent, there may be pressure on the chip from the adjacent encapsulating material, which puts pressure on the chip, which in turn tends to move the connection surface of the chip away from the desired common plane condition. This may adversely affect the connection steps of the method. In addition, the presence of a gap may cause the interconnection layer(s) to be deformed in the region of the gap, which also adversely affects the ability to make reliable connections.

According to an aspect of the invention, the gap(s) 912a, 912b, 912c, . . . between the semiconductor chips 512am 412b, 512c, . . . and the surrounding encapsulating material 210 of FIG. 9 is filled with a dielectric material to prevent distortion of the interconnect layers. In the simplest method, a syringe filled with hardenable material is used to manually fill the gap around each of the semiconductor chips, as suggested by the syringe 920 of FIG. 9, dispensing material 922. The material 922 may be encapsulating material corresponding to that of of substrate 210, or it may be an elastomeric material such as a silicone elastomer, or it may be a low-density but rigid material such as a foamed polymer.

Figure 10:
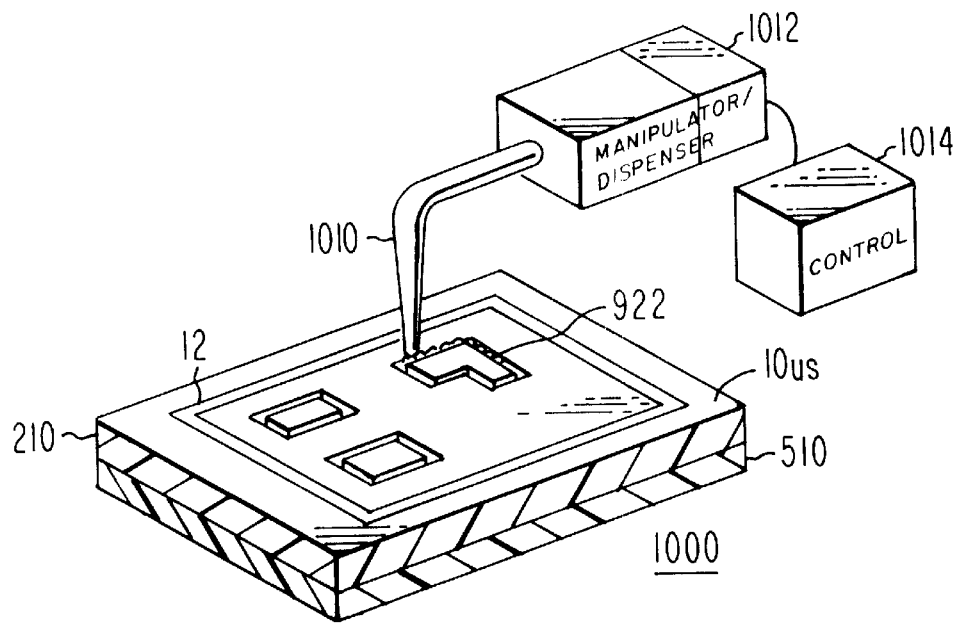
FIG. 10 is similar to FIG. 9, but involves the use of an automatic or programmable dispensing apparatus for filling certain gaps.

When high-precision equipment is used to fabricate the basic structure of assemblage 600 of FIG. 6, the width of the gap surrounding each semiconductor chip may be of uniform width, so that an automatic preprogrammed dispenser can be used to perform the filling automatically. In FIG. 10, the structure of FIG. 9 is associated with an automatic preprogrammed dispenser designated generally as 1000, which includes a dispensing nozzle 1010 moved under by a manipulator/dispenser 1012 under the control of a controller 1014. Such dispensing machines are known in the art, and require no further explanation. As in the case of the manually controlled syringe dispensing, the hardenable material may be the same as the encapsulating material, if appropriate for syringe deposition, or it may be another material selected to take up strains due to stress. Such a material might be a silicone encapsulant. For some situations, a foamed material might be appropriate, since it would tend to have better compliance than the equivalent non-foamed material. In one embodiment of the invention in which Plastikon was used as the substrate or encapsulant material, the fill material was silicone polyimide (SPI) epoxy, and in another embodiment the material was Hysol Dexter epoxy.

Thus, a method according to an aspect of the invention is for generating a multi-chip module (800). The method comprises the steps of procuring a dielectric sheet (10) defining a surface (10us) and tensioning (f) the dielectric sheet, as by use of a frame, to provide a measure of rigidity to the surface (10us). One or more electrical conductors (12) is applied to the surface (10us) of the dielectric sheet (10) in a predetermined pattern. The electrical conductors (12) have a predetermined thickness. In one embodiment of the invention, the thickness is 40 thousandths of an inch, and the surface of the dielectric sheet is coated with adhesive (14) to retain the conductors (12). Encapsulating material (210) is applied to the surface of the dielectric sheet in a thickness sufficient to encapsulate the electrical conductors (12), to thereby generate a rigid substrate element (200). Wells or apertures, which may be through apertures (410a, 410b), are fabricated, formed or defined in the rigid substrate element (200) at predetermined locations at which semiconductor or solid-state chips (512a, 512b) are to be placed in or on the multi-chip module (800). The semiconductor or solid-state chips (410a, 410b) are placed on a second dielectric sheet or substrate (510) at locations registered with the apertures or through apertures (410a, 410b), with electrical pads, electrodes, or interconnects (512ap, 512ap2, 512bp) of the chips (410a, 410b) facing in a particular direction. In a particular embodiment of the invention, the second dielectric sheet (510) has adhesive (510a) on one of its surfaces, and that side of the semiconductor or solid-state chips (410a, 410b) having electrical connection pads or electrodes (512ap, 512ap2, 512bp) of the semiconductor or solid-state chips (410a, 410b) are placed on the adhesive (510a) of the second sheet (510). The rigid substrate element with apertures (400) is affixed to the second dielectric sheet (510) with the semiconductor or solid-state chips (410a, 410b) extending into or through the wells or apertures (410a, 410b). A flexible multilayer dielectric interconnection sheet carrying interconnection conductor patterns (510, 812) is formed on, andor applied over, at least the electrical connection pads or electrodes (512ap, 512ap2, 512bp) of some of the semiconductor or solid-state chips (410a, 410b), for making connections between at least some of the interconnection conductor patterns (714a, 714b, 714c, 814a, 814b, 814c) of the interconnection sheet (510, 812) and some of the electrical connection pads (512ap, 512ap2, 512bp). In a particular embodiment of the invention, the connections are made with the aid of plated-through vias (712a, 712b, 712c, 814a, 814b, 814c).

In one variant of the method, a layer of encapsulant material is removed, shaved or ground from at least one surface of the rigid substrate element (200) before the step of affixing the rigid substrate element to the second dielectric sheet. In another variant, the step of applying to the surface (10us) of the dielectric sheet 910), in a predetermined pattern, one or more electrical conductors (12) having a predetermined thickness includes the step of applying adhesive (14) to the surface (10us) of the dielectric sheet (10), and applying the one or more electrical conductors (12) to the adhesive (14). In another mode of the method of the invention, an electrically conductive plate (810) is affixed to the rigid substrate element (300) on that side of the multichip module (800) remote from the flexible multilayer dielectric interconnection sheet (510, 812).

According to an aspect of the invention, the gaps (912a, 912b, 912c, . . . ) between the rigid substrate element (200) and the semiconductor or solid-state chips (512a, 512b) or other components and the associated wells or apertures (410a, 410b, 410c, . . . ) are filled with a hardenable (curable) filler material (922). The filling may be accomplished by means of manually operated tools (920) or by means of automatic or programmed dispensing machines (1000).

What is claimed is:

1. A method for generating a substrate for a multi-chip module, said method comprising the steps of:

tensioning a dielectric sheet defining a surface, to provide a measure of rigidity to said surface;

applying to said surface of said dielectric sheet, in a predetermined pattern, one or more electrical conductors having a predetermined thickness;

applying encapsulating material to said surface of said dielectric sheet in a thickness sufficient to encapsulate said electrical conductors to thereby generate a rigid substrate element;

fabricating through apertures in said rigid substrate element at predetermined locations at which chips are to be placed on said multi-chip module, with each of said through apertures having dimensions larger than those of the chip which will occupy the aperture;

placing chips on a second dielectric substrate at locations registered with said through apertures, with electrical interconnects of said chips facing in a particular direction;

affixing said rigid substrate element to said second dielectric sheet with said chips extending into said through apertures, whereby a gap lies between said semiconductor chips and their associated apertures;

filling said gaps with a hardenable dielectric material; and applying a flexible multilayer dielectric interconnection sheet over at least said electrical interconnects of said chips, and making connections between at least some of the interconnects of said interconnection layer and some of said electrical interconnects of said chips.

2. A method according to claim 1, further inclding the step of removing encapsulating material from at least one surface of said rigid substrate element before said step of affixing said rigid substrate element to said second dielectric sheet.

3. A method according to claim 1, wherein said step of applying to said surface of said dielectric sheet, in a predetermined pattern, one or more electrical conductors having a predetermined thickness includes the step of applying adhesive to said surface of said dielectric sheet and applying said one or more electrical conductors to said adhesive.

4. A method according to claim 1, wherein said hardenable material is the same as said encapsulating material.

5. A method according to claim 1, wherein said hardenable material is elastic or elastomeric.

6. A method according to claim 1, wherein said hardenable material is foamed.

* * * * *